United States Patent [19]

Connell et al.

[11] Patent Number: 4,587,483
[45] Date of Patent: May 6, 1986

[54] MEASUREMENT OF ELAPSED TIME FOR A PREDETERMINED FREQUENCY SHIFT

[75] Inventors: Peter P. R. Connell, Marlow; Michael Yeomans, Maidenhead, both of England

[73] Assignee: RACAL-DANA Instruments, Ltd., Berkshire, England

[21] Appl. No.: 535,819

[22] Filed: Sep. 26, 1983

[30] Foreign Application Priority Data

Oct. 1, 1982 [GB] United Kingdom ............... 8228102

[51] Int. Cl.⁴ .............................................. G01R 23/14
[52] U.S. Cl. .................................... 324/79 R; 331/38
[58] Field of Search ................ 324/78 R, 78 F, 78 Z, 324/79 D, 79 R; 364/484, 841; 307/525, 527, 517, 519; 343/17.7; 331/64, 38, 39; 377/19, 20; 179/84 VF, 175.26 (U.S. only), 175.3 R; 340/825.48, 825.73, 825.74, 825.76

[56] References Cited

U.S. PATENT DOCUMENTS 2,666,141  1/1954  Clapp .................................. 331/38

Primary Examiner—Michael J. Tokar
Attorney, Agent, or Firm—Leydig, Voit & Mayer, Ltd.

[57] ABSTRACT

The circuit arrangement described measures the time when a frequency $F_o$, changing towards a desired frequency value, differs by not more than a predetermined amount (e.g. 100 Hz) from the desired value. Initially $F_o$ is mixed with the sum of 10 MHz and the new desired value for $F_o$. The lower sideband is selected and thus produces a frequency $F_1$ which is thus always 10 MHz when $F_o$ reaches its desired value (which may be variable). The circuit therefore has to measure when $F_1$ comes within 100 Hz of 10 MHz. Initially $F_1$ is multiplied by a predetermined multiplication factor ($\times 100$) and the product subtracted from a reference frequency. The latter is the sum of a fixed frequency of 300 KHz and of 10 GHz (i.e. 10 MHz multiplied by 100). This therefore produces an output frequency $F_2$ whose value differs from 300 KHz by 100 Hz$\times$100 (or 10 KHz) when $F_1$ differs from 10 MHz by 100 Hz. It is therefore a relatively simple matter to determine a 10 KHz difference in 300 KHz, by detecting the output of a filter and comparing this with a reference.

7 Claims, 1 Drawing Figure

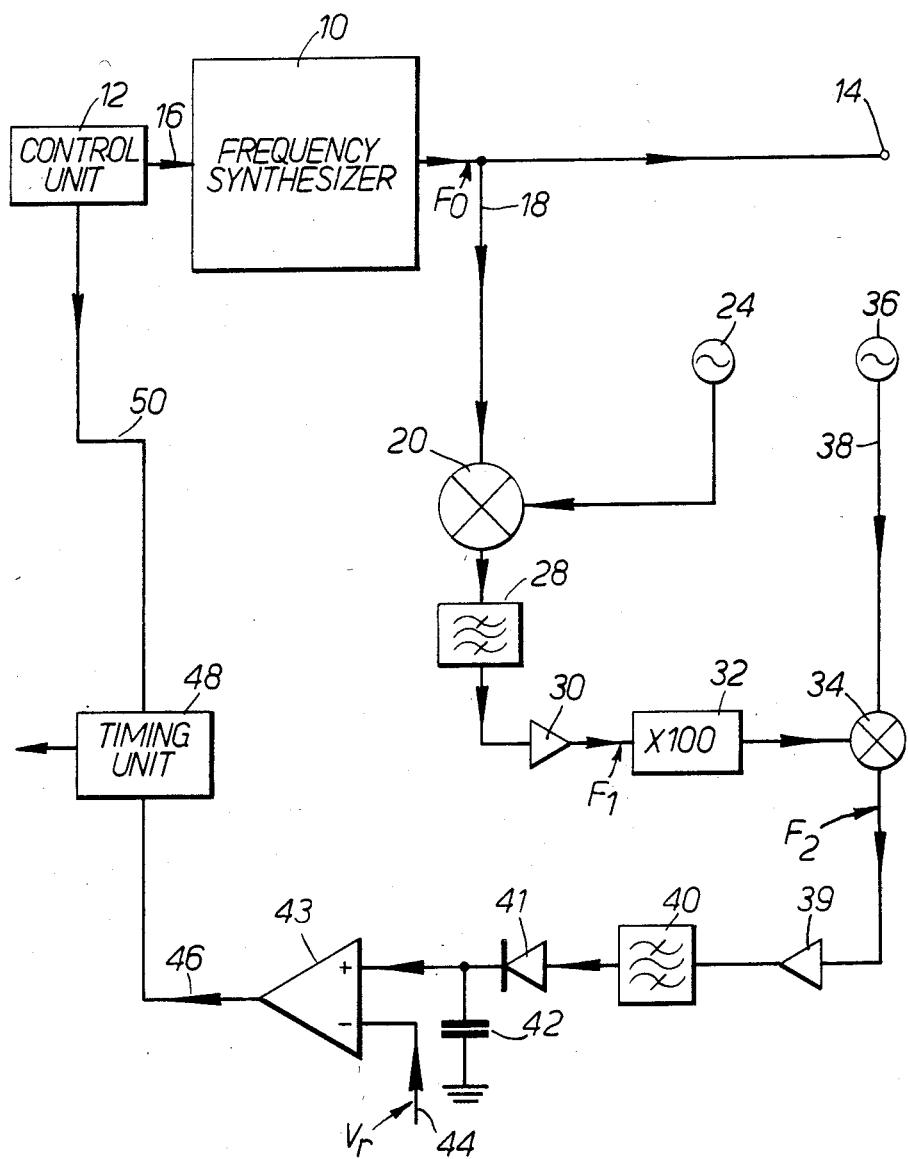

MEASUREMENT OF ELAPSED TIME FOR A PREDETERMINED FREQUENCY SHIFT

BACKGROUND OF THE INVENTION

The invention relates to electrical circuit arrangements and more specifically to electrical circuit arrangements for use in measuring the time taken to achieve a required change in frequency.

There are many applications where a frequency producing arrangement (e.g. a frequency synthesizer in radio communications apparatus) is required to make very rapid changes in frequency between two specific frequency values. It is not possible in practice for such changes to take place instantaneously and it is therefore important to know, e,g, in testing and setting up such frequency producing arrangements, the time taken for a specific frequency change to be achieved, such as, for example, for the output frequency to be not more than a specified (relatively small) number of Hertz away from the required final value.

BRIEF SUMMARY OF THE INVENTION

According to the invention, there is provided a method of determining the time when a changing frequency changing towards a new frequency value differs by not more than a predetermined amount from the new value comprising the steps of multiplying the changing frequency by a predetermined multiplication factor, subtracting the resultant product from a reference frequency which is the sum of a predetermined frequency and the changing frequency multiplied by the predetermined factor so as to produce an output frequency whose value differs from the predetermined frequency by an amount which corresponds to the amount by which the changing frequency differs from the desired value multiplied by the predetermined factor, and measuring the difference between the output frequency and the predetermined frequency.

According to the invention, there is also provided an electrical circuit arrangement for determining the time when an changing frequency changing towards a new frequency value differs by not more than a predetermined amount from the new value, comprising means for multiplying the changing frequency by a predetermined multiplication factor, means for subtracting the resultant product from a reference frequency which is the sum of a predetermined frequency and the changing frequency multiplied by the predetermined factor so as to produce an output frequency whose value differs from the predetermined frequency by an amount which corresponds to the amount by which the changing frequency differs from the new value multiplied by the predetermined factor, and means for measuring the difference between the output frequency and the predetermined frequency.

According to the invention, there is further provided a frequency shift timing arrangement for measuring the time taken for an changing frequency changing towards a new frequency value to differ therefrom by not more than a predetermined amount, comprising frequency multiplying means for multiplying the changing frequency by a predetermined multiplication factor, mixing means for mixing the multiplied changing frequency with a fixed reference frequency which is the sum of a predetermined frequency and the changing frequency multiplied by the predetermined multiplication factor so as to produce an output frequency whose value differs from the predetermined frequency by an amount which is the product of the multiplication factor and the amount by which the changing frequency differs from the said new value, detecting means for detecting the time instant when the value of the output frequency differs from the predetermined frequency by not more than the product of the multiplication factor and the said predetermined amount, and timing means connected to measure the elapsed time between the said time instant and the time instant when the change in the changing frequency was first demanded.

DESCRIPTION OF THE DRAWINGS

Frequency shift timing arrangements embodying the invention will be described, by way of example only, with reference to the accompanying diagrammatic drawing which is a circuit diagram of one of the arrangements.

As shown in FIG. 1, the circuit arrangement to be described is intended to measure the time taken for specific frequency shifts to be achieved by a frequency synthesizer 10. The frequency synthesizer 10 may be of any appropriate type and is arranged to be controllable, such as by control unit 12, to produce an output of the required frequency at a terminal 14. Each time the control unit 12 demands a change in the frequency of the output signal at terminal 14, it sends an appropriate control signal to the synthesizer on a line 16 and this causes the frequency synthesizer to be reset to the new frequency. The circuit arrangement to be described measures the time which elapses between the instant when the control unit 12 demands the new frequency and the instant when the actual frequency of the output signal at terminal 14 has changed to within 100 Hz (in this example) of the required value.

As shown in FIG. 1, the frequency designated $F_o$ from the synthesizer 10 is fed on a line 18 to a mixer 20. Mixer 20 also receives a stable frequency of $(F_f+10)$ MHz from a reference source 24 where $F_f$ is the new frequency to which the output $F_o$ is changing. The lower sideband output of mixer 20 is therefore $(F_f-F_o+10)$ MHz and this is selected by a bandpass filter 28 having a centre frequency of 10 MHz and a suitably wide pass band, and the filter output is fed through a buffer amplifier 30 to a frequency multiplier 32 having a multiplication factor of 100. $F_f$ may be derived from a stable signal generator which is programmed to produce the required frequencies $(F_f+10)$ MHz, e.g. in a pre-arranged test programme.

In this way, the output of the buffer amplifier 30 carriers all the frequency changes of $F_o$ (that is, those changes which are permitted to pass by the filter 28) but these changes are now with reference to a fixed frequency (10 MHz) instead of with reference to $F_o$ (the latter will of course have a wide range of values according to the range of the synthesizer 10). In the timing arrangement being described, it is desired to determine the time taken for $F_o$ to come within 100 Hz of the desired final value for the output frequency, and it therefore follows that this time can be measured by determining the time taken for the changing frequency (referred to below as $F_1$) from the buffer 30 to change to within 100 Hz of 10 MHz.

After frequency multiplication by 100 in the frequency multiplier 32, the multiplied frequency 100 $F_1$ is applied to one input of a mixer 34 whose second input receives a stable reference frequency from a reference source 36 on a line 38, this reference frequency having a value of 1 GHz+300 KHz.

It will therefore be seen that the lower sideband output of mixer 34, $F_2$, will be 300 KHz+/−10 KHz when $F_1$ has the value 10 MHz+/−100 Hz. In other words, the circuit arrangement will now determine when $F_o$ comes within 100 Hz of the required value for the synthesizer output frequency by determining when $F_2$ is within 10 KHz of 300 KHz.

The frequency $F_2$ is fed through a buffer amplifier 39 to a band pass filter 40 having a centre frequency of 300 KHz and a pass band of 20 KHz. The output is detected by a detecting arrangement comprising a diode 41 and a smoothing capacitor 42 and the resultant d.c. level is applied to one input of a comparator 43 whose second input receives a reference voltage $V_r$ on a line 44. The comparator output which occurs when the d.c. output from the diode 41 exceeds the reference $V_r$ is fed on a line 46 to one input of a time measuring circuit 48. The second input of the circuit 48 is fed with a signal on a line 50 at the instant when the control unit 12 demands the required change in frequency.

Timing unit 48 is therefore arranged to measure the elapsed time between the instant when it receives the signal on line 50 indicating that the required frequency change has been demanded and the instant when it receives the signal on line 46 - which indicates when $F_2$ has come within 10 KHz of 300 KHz and thus indicates when $F_o$ has come within 100 Hz of the demanded output frequency.

It will therefore be seen that the frequency multiplication and frequency changing provided by the multiplier 32 and the mixer 34 shift the frequency measurement required from one requiring detection of 100 Hz in 10 MHz (which would clearly be very difficult indeed) to one requiring detection of 10 KHz in 300 KHz (which is clearly much easier).

The value of $V_r$ on line 44 corresponds to the two points 3 db down from the peak output of the filter 40.

The frequency values given above are merely examples and are not intended to be restrictive in any way. Likewise, it will be appreciated that many changes can be made to the actual form of the circuit arrangement.

What is claimed is:

1. A method of determining the time instant when a changing frequency changing towards a new frequency value differs by not more than a predetermined amount from the new value, comprising the steps of
    multiplying the said changing frequency by a predetermined multiplication factor,
    generating a reference frequency which is the sum of (a) a predetermined frequency and (b) the said new frequency value multiplied by the predetermined factor,
    subtracting the product resulting from the multiplication step from the reference frequency so as to produce an output frequency whose value differs from the predetermined frequency by an amount which corresponds to the amount by which the said changing frequency differs from the new frequency value multiplied by the predetermined factor,
    measuring the difference between the output frequency and the predetermined frequency as the said changing frequency changes towards the new frequency value and thus changes the output frequency towards the predetermined frequency, and
    determining the time instant when the output frequency differs from the predetermined frequency by not more than the predetermined amount multiplied by the predetermined factor.

2. A method according to claim 1, in which the said changing frequency is derived from another changing frequency by frequency-changing such that the new value for the first-mentioned changing frequency is constant but the new value for the second-mentioned changing frequency can be altered.

3. An electrical circuit arrangement for determining the time when a changing frequency changing towards a new frequency value differs by not more than a predetermined amount from the new value, comprising:
    means for multiplying the changing frequency by a predetermined multiplication factor,
    means for generating a reference frequency which is the sum of (a) a predetermined frequency and (b) the new frequency value multiplied by the predetermined factor,
    means for subtracting the product resulting from the multiplication means from the reference frequency so as to produce an output frequency whose value differs from the predetermined frequency by an amount which corresponds to the amount by which the changing frequency differs from the new frequency value multiplied by the predetermined factor,
    means for measuring the difference between the output frequency and the predetermined frequency as the changing frequency changes towards the new frequency value and thus changes the output frequency towards the predetermined frequency, and
    means for determining the time instant when the output frequency differs from the predetermined frequency by not more than the predetermined amount multiplied by the predetermined factor.

4. A circuit arrangement according to claim 3, including frequency changing means for deriving the said changing frequency from another changing frequency by frequency-changing such that the new frequency value for the first-mentioned changing frequency is constant but the new frequency value for the second-mentioned changing frequency can be altered.

5. A frequency shift timing arrangement for measuring the time taken for a changing frequency changing towards a new frequency value to differ therefrom by not more than a predetermined amount, comprising:
    frequency multiplying means for multiplying the changing frequency by a predetermined multiplication factor,
    means for generating a fixed reference frequency which is the sum of (a) a predetermined frequency and (b) the said new frequency multiplied by the predetermined multiplication factor,
    mixing means for mixing the multiplied said changing frequency with the reference frequency so as to produce an output frequency whose value differs from the predetermined frequency by an amount which is the product of the multiplication factor and the amount by which the changing frequency differs from the said new frequency value,
    detecting means for detecting the time instant when the value of the output frequency differs from the predetermined frequency by not more than the product of the multiplication factor and the said predetermined amount, and timing means connected to measure the elapsed time between the said time instant and the time instant when the change in the changing frequency was first demanded.

6. A frequency shift timing arrangement for measuring the time taken for a first changing frequency, which can change towards a new frequency value having any selected one of a range of values, to differ from the selected value by not more than a predetermined amount, comprising frequency changing means for deriving a second changing frequency from the first changing frequency such that the second changing frequency changes with the changing of the first changing frequency and reaches the same fixed new frequency value irrespective of which is the selected one of the range of values of the new frequency for the first changing frequency, frequency multiplying means for multiplying the second changing frequency by a predetermined multiplication factor, means for generating a fixed reference frequency which is the sum of (a) a predetermined frequency and (b) the said new frequency value multiplied by the predetermined multiplication factor, mixing means for mixing the multiplied said second changing frequency with the reference frequency so as to produce an output frequency whose value differs from the predetermined frequency by an amount which is the product of the multiplication factor and the amount by which the second changing frequency differs from the said new frequency value, detecting means for detecting the time instant when the value of the output frequency differs from the predetermined frequency by not more than the product of the multiplication factor and the said predetermined amount, and timing means connected to measure the elapsed time between the said time instant and the time instant when the change in the first changing frequency was first demanded, whereby the elapsed time measured by the timing means is the time between the time instant when the first changing frequency differs by not more than the said predetermined amount from the said selected one of the range of values for the new frequency and the time instant when the change in the first said changing frequency is first demanded.

7. A circuit arrangement according to claim 6, in which the frequency changing means comprises mixing means for mixing the first changing frequency with the sum of the first changing frequency and a reference frequency equal to the selected one of the values for the new frequency of the first changing frequency, whereby the second changing frequency is the difference output of that mixing means.

* * * * *